(12) United States Patent
Koyama et al.

(10) Patent No.: US 9,231,521 B2
(45) Date of Patent: Jan. 5, 2016

(54) OSCILLATOR (71) Applicant: CANON KABUSHIKI KAISHA, Tokyo (JP)

(72) Inventors: Yasushi Koyama, Kamakura (JP); Ryota Sekiguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/226,704

(22) Filed: Mar. 26, 2014

(65) Prior Publication Data

US 2014/0292428 A1 Oct. 2, 2014

(30) Foreign Application Priority Data

Mar. 29, 2013 (JP) .................................. 2013-073648

(51) Int. Cl.
*H03B 7/14* (2006.01)
*H03B 7/08* (2006.01)

(52) U.S. Cl.
CPC .. *H03B 7/14* (2013.01); *H03B 7/08* (2013.01); H03B 2200/0084 (2013.01)

(58) Field of Classification Search
CPC ............. H03B 7/00; H03B 7/12; H03B 7/08; H03B 7/14; H03B 2200/0032; H03B 2200/0084
USPC ....................................... 331/107 T, 132, 115
See application file for complete search history.

(56) References Cited

U.S. PATENT DOCUMENTS

| 7,274,263 | B2 | 9/2007 | Kazakov |
| 2007/0279136 | A1* | 12/2007 | Koyama et al. ............ 331/107 T |
| 2012/0001698 | A1* | 1/2012 | Koyama et al. ............ 331/107 T |
| 2012/0068778 | A1* | 3/2012 | Sekiguchi ..................... 331/132 |
| 2012/0119838 | A1* | 5/2012 | Koyama et al. ............... 331/115 |

FOREIGN PATENT DOCUMENTS

| JP | 2006-101495 A | 4/2006 |
| JP | 2007-124250 A | 5/2007 |
| WO | WO 2011027672 A1 * | 3/2011 |

OTHER PUBLICATIONS

M. Reddy et al., Monolithic Schottky-Collector Resonant Tunnel Diode Oscillator Arrays to 650 GHz, IEEE Electron Device Letters, vol. 18, No. 5, May 1997, pp. 218-221.

Masahiro Asada et al., Resonant Tunneling Diodes for Sub-Terahertz and Terahertz Oscillators, Japanese Journal of Applied Physics vol. 47, No. 6, 2008, pp. 4375-4384.

* cited by examiner

*Primary Examiner* — Ryan Johnson
(74) *Attorney, Agent, or Firm* — Canon USA, Inc., IP Division (57) ABSTRACT

An oscillator oscillates a terahertz wave of a frequency $f_{osc}$ defined by a microstrip resonator configured such that a negative resistance element and a dielectric body are sandwiched between two conductors. The oscillator includes a resistance element disposed in parallel to the negative resistance element. The resistance element is disposed in a position corresponding to a node of an electric field stably existing in the resonator in the frequency $f_{osc}$ of the oscillated terahertz wave.

12 Claims, 7 Drawing Sheets

OSCILLATOR

BACKGROUND OF THE INVENTION

1. Field of the Invention

The present invention relates to oscillators using a negative resistance element and particularly relates to an oscillator for electromagnetic waves in frequency bands in a frequency domain from a millimeter-wave band to a terahertz-wave band (from 30 GHz inclusive to 30 THz inclusive; hereinafter, used as the same meaning).

2. Description of the Related Art

Absorption peaks derived from structures and states of a large number of organic molecules such as biomaterials, medical products, and electronic materials are included in a frequency domain of terahertz-waves. Furthermore, terahertz waves have high permeability relative to materials such as paper, ceramic, resin, and cloths. In recent years, imaging techniques and sensing techniques making use of such a characteristic of the terahertz waves have been studied and developed. For example, application to fluoroscopic apparatuses which is substitute of an X-ray apparatuses and in-line nondestructive inspection apparatuses in fabrication processes is expected.

As a current injection type light source which generates electromagnetic waves in this frequency domain, oscillators configured such that a resonator is mounted on a negative resistance element have been widely used. Japanese Patent Laid-Open No. 2007-124250 discloses an oscillator for terahertz waves configured such that a negative resistance element serving as a double-barrier resonant tunneling diode (hereinafter referred to as an "RTD") and a resonator serving as a slot antenna are mounted on a semiconductor substrate. The oscillator oscillates terahertz waves in room temperature using differential negative resistance based on intersubband transition of electrons in a semiconductor multiple quantum well structure of the RTD. Japanese Patent Laid-Open No. 2006-101495 discloses an oscillator for terahertz waves configured such that an RTD and a microstrip resonator are mounted on the same substrate.

In general, an oscillator using a negative resistance element generates parasitic oscillation caused by a bias circuit which includes a power source and wiring and which is used to control a bias voltage of the negative resistance element. The parasitic oscillation which means oscillation in a parasitic way in lower frequency bands relative to a desired frequency reduces oscillation output in the desired frequency. Assuming that an oscillation wavelength of the oscillator is denoted by $\lambda_{osc}$ and an oscillation frequency is denoted by $f_{osc}$, in order to suppress the parasitic oscillation, impedance of a bias circuit is made to be low in a frequency domain not less than DC and not larger than $f_{osc}$. To realize this situation, a method for disposing a low impedance circuit in a position within $\lambda_{osc}/4$ from an RTD toward a power source has been proposed.

Figure 7:
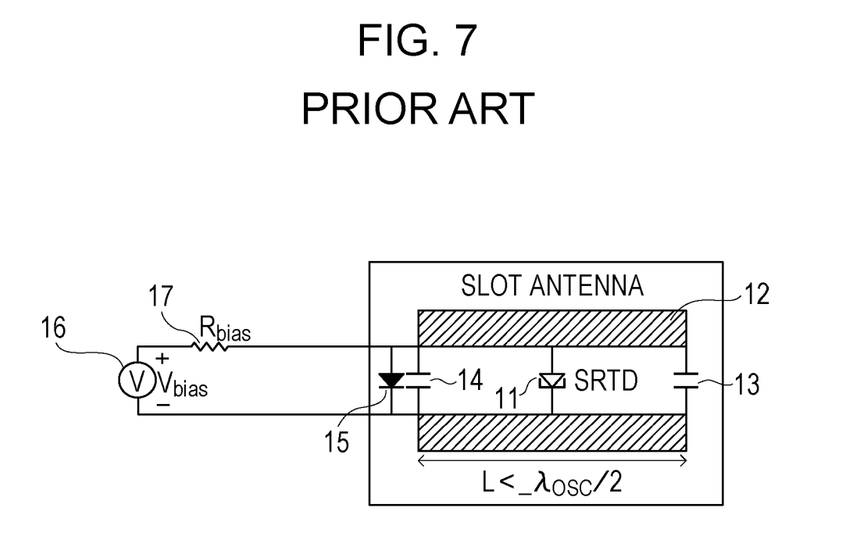
FIG. 7 is a diagram illustrating the related art.

For example, in IEEE Electron Device Letters, Vol 18,218 (1997), as illustrated in FIG. 7, a rectifier diode 15 is disposed in a position within $\lambda_{osc}/4$ from an S-RTD 11 toward a power source 16 as a low impedance circuit. A reference numeral 17 represents a sum of an internal resistance of the power source 16 and a resistance of a connecting conductor. In Japanese Patent Laid-Open No. 2007-124250, a low impedance circuit including a parallel resistor having a bismuth thin-film resistance structure and a parallel capacitor formed by metal/insulator/metal (MIM) is mounted on a substrate in which the RTD and the slot antenna are mounted so that oscillation operation in a frequency band of terahertz waves is realized.

Also in the oscillator using the microstrip type resonator such as a patch antenna disclosed in Japanese Patent Laid-Open No. 2006-101495, a low impedance circuit is disposed to suppress parasitic oscillation so that oscillation of terahertz waves is attained. However, the techniques disclosed in Japanese Patent Laid-Open No. 2007-124250 and IEEE Electron Device Letters, Vol. 18,218 (1997) simply refer to a structure for a slot type resonator, and therefore, it is not easy to employ the techniques in microstrip type resonators. Specifically, in a case of a patch antenna, for example, a region within $\lambda_{osc}/4$ from a negative resistance element toward a bias circuit includes a patch antenna itself serving as a resonator or peripheral members disposed in the vicinity of the patch antenna. Therefore, in the microstrip type resonator, it is difficult to dispose a low impedance circuit without interfering with the resonator. Furthermore, since a wiring structure used to control a bias voltage of the negative resistance element is disposed in the vicinity of the resonator, parasitic oscillation in comparatively high frequencies caused by the structure should be suppressed.

SUMMARY OF THE INVENTION

According to an aspect of the present invention, an oscillator is capable of suppressing generation of parasitic oscillation in a frequency domain not less than DC and not more than $f_{osc}$ in a microstrip resonator such as a patch antenna and stably performing oscillation operation in an oscillation frequency $f_{osc}$ in a desired terahertz-wave band.

According to an embodiment of the present invention, there is provided an oscillator which oscillates a terahertz wave of a frequency $f_{osc}$ defined by a microstrip resonator configured such that a negative resistance element and a dielectric body are sandwiched between two conductors. The oscillator includes a resistance element disposed in parallel to the negative resistance element. The resistance element is disposed in a position corresponding to a node of an electric field stably existing in the resonator in the frequency $f_{osc}$ of the oscillated terahertz wave.

Further features of the present invention will become apparent from the following description of exemplary embodiments with reference to the attached drawings.

DESCRIPTION OF THE EMBODIMENTS

Figure 1A:
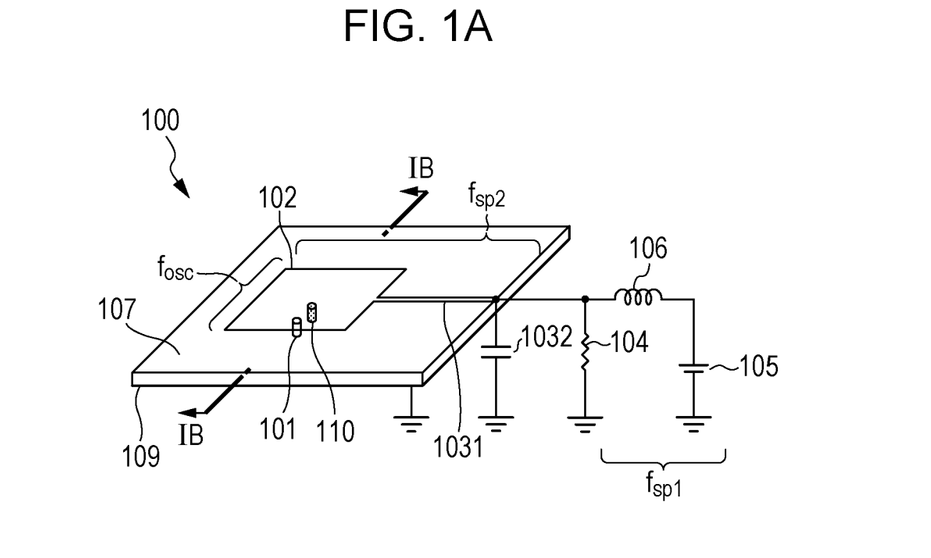
FIG. 1A is a diagram illustrating a configuration of an oscillator according to an embodiment of the present invention and FIG. 1B is a sectional view of the oscillator according to an embodiment of the present invention taken along a line IB.
Figure 1B:
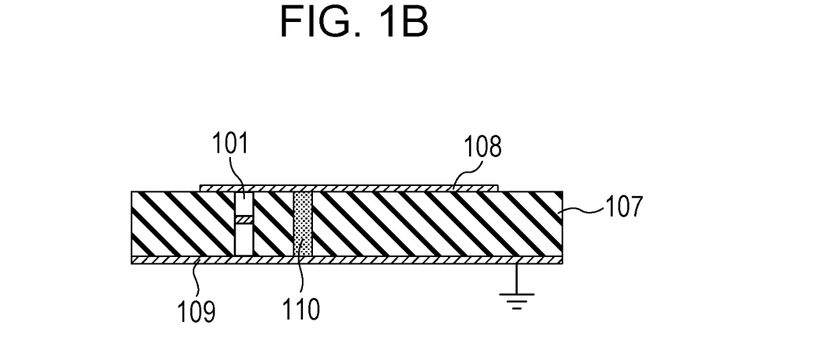
Figure 2:
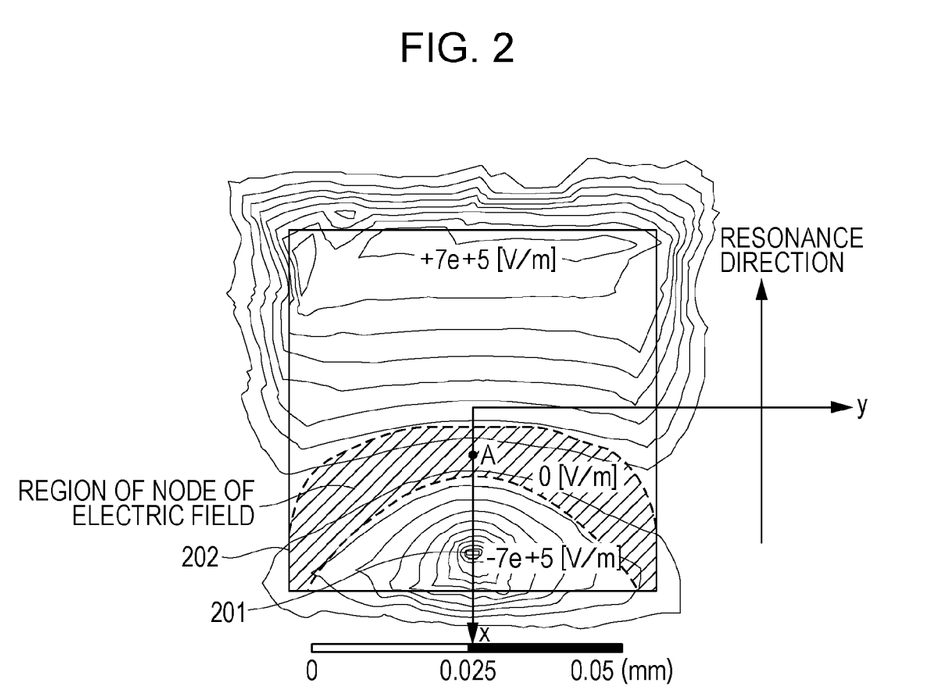
FIG. 2 is a diagram illustrating a resonance electric field of the oscillator according to an embodiment of the present invention.
Figure 3A:
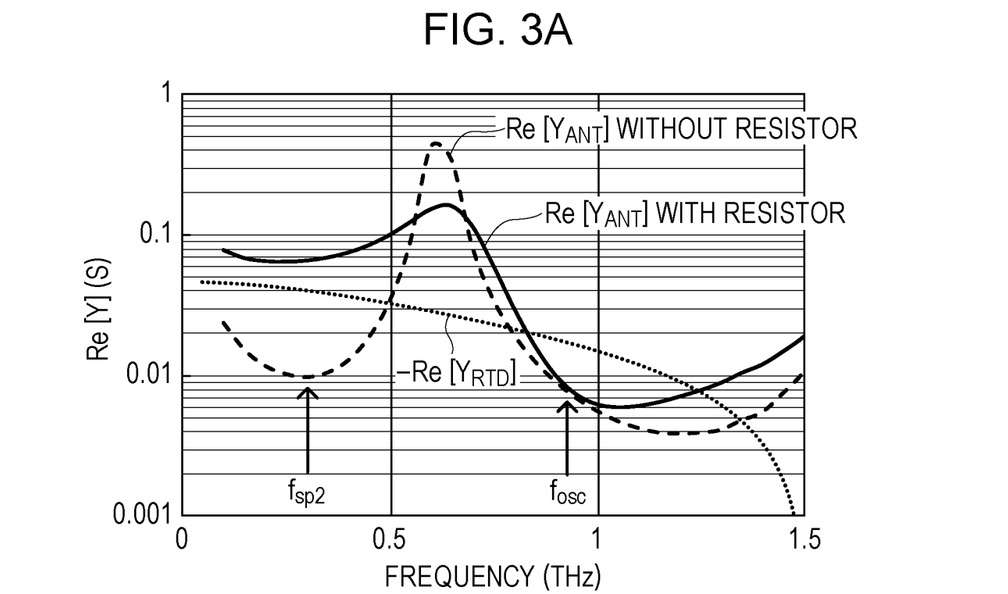
FIGS. 3A and 3B are diagrams illustrating admittance characteristics of the oscillator according to an embodiment of the present invention embodiment.
Figure 3B:
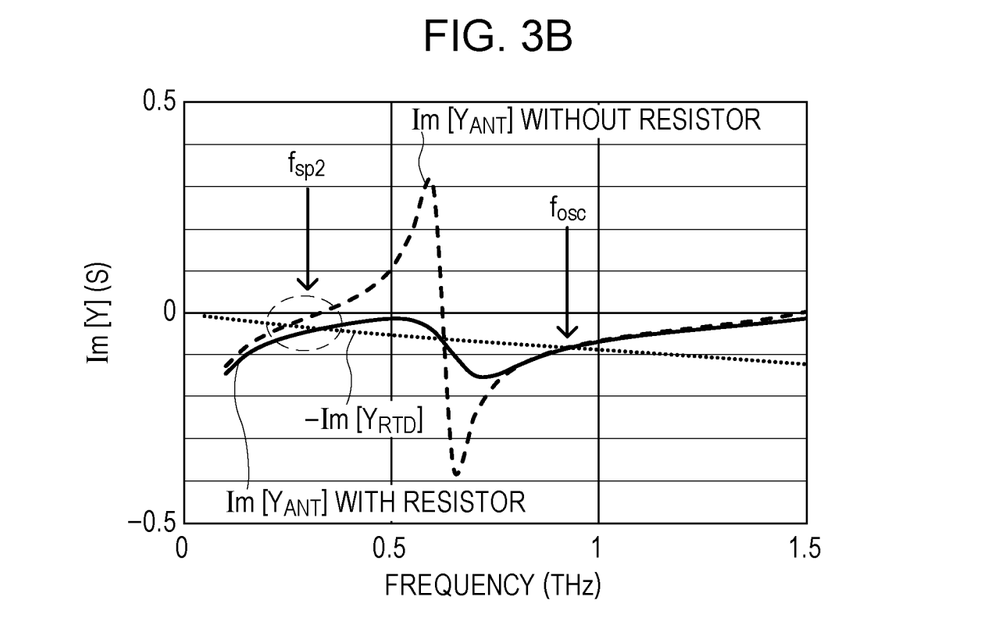
Figure 4A:
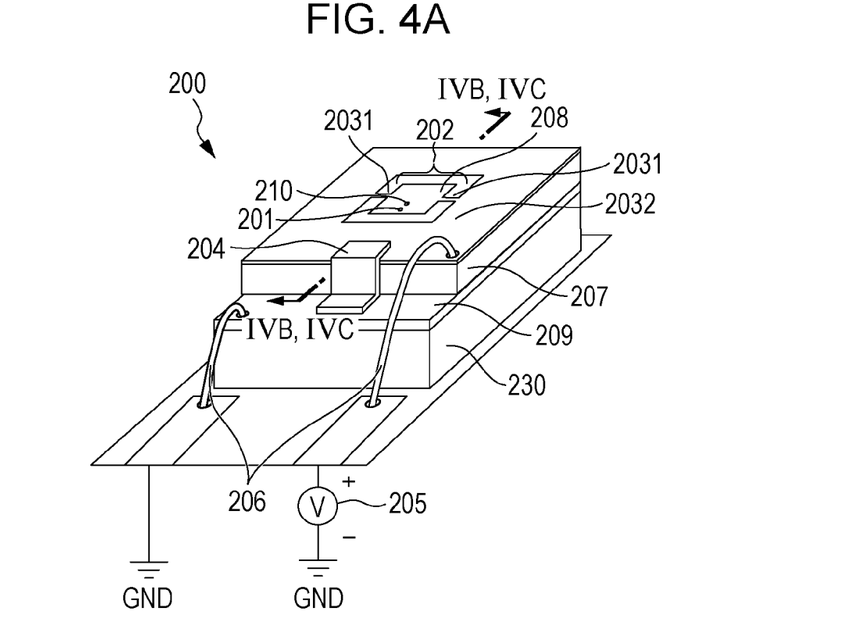
FIG. 4A is a diagram illustrating a configuration of an oscillator of a first example.
Figure 4B:
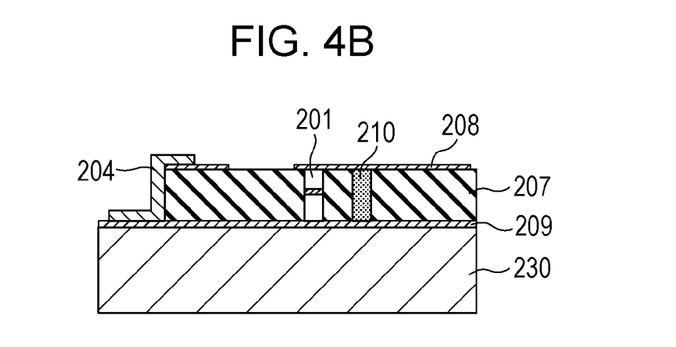
FIG. 4B is a sectional view of the oscillator of the first example taken along a line IVB.
Figure 5A:
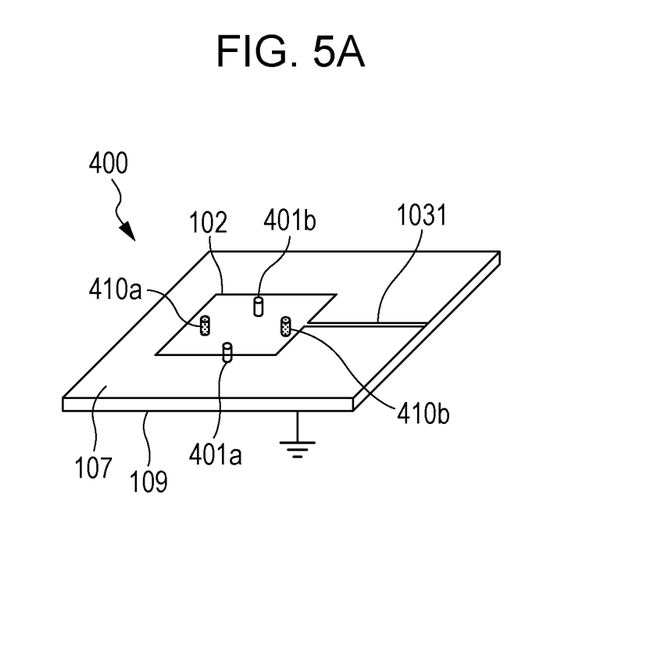
FIG. 5A is a diagram illustrating a modification of the oscillator according to an embodiment of the present invention and FIG. 5B is a diagram illustrating another modification of the oscillator according to an embodiment of the present invention.
Figure 5B:
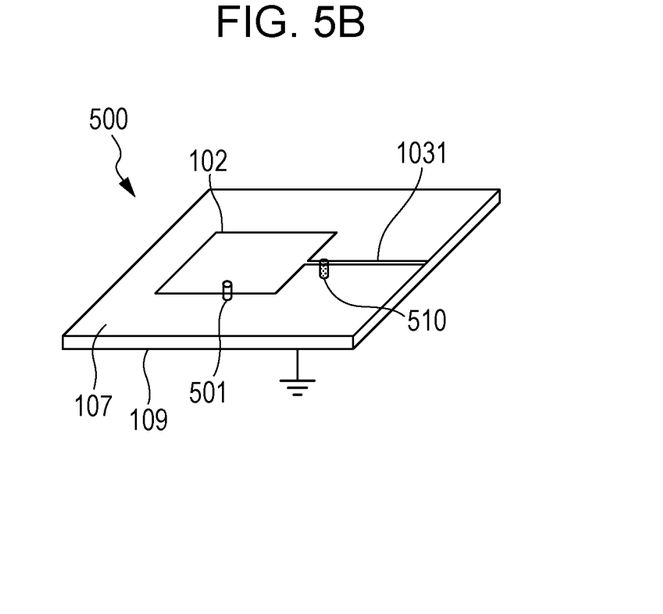
Figure 6A:
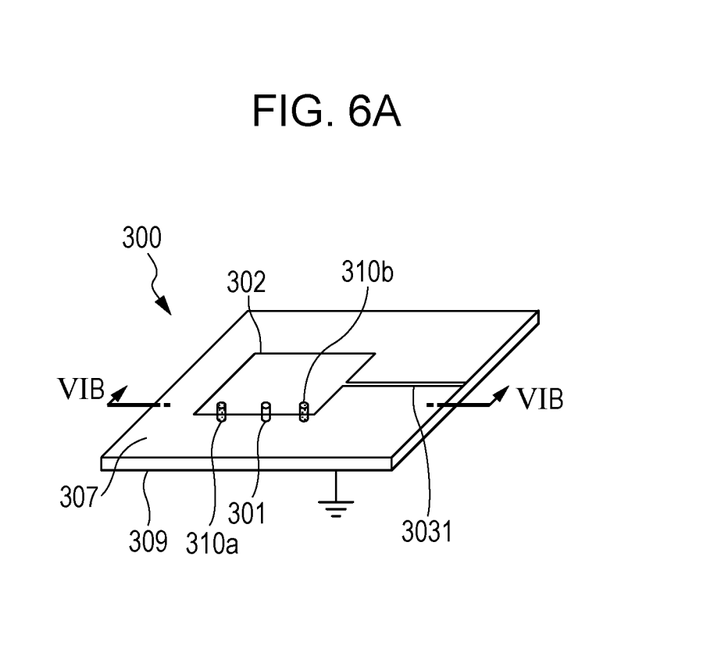
FIG. 6A is a diagram illustrating a configuration of an oscillator of a second example and FIG. 6B is a sectional view of the oscillator of the second example taken along a line VB.
Figure 6B:
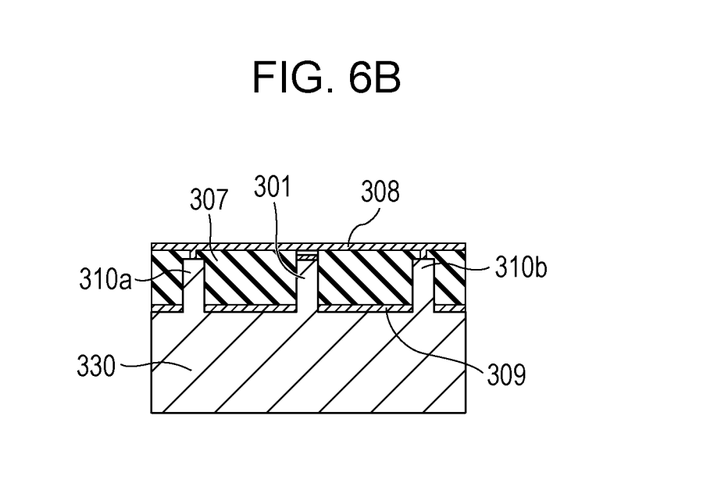

An oscillator 100 according to an embodiment and modifications and alternatives thereof will be described with reference to FIGS. 1A and 1B to FIGS. 6A and 6B. FIG. 1A is a perspective view illustrating appearance of the oscillator 100 according to the present invention and FIG. 1B is a sectional view of the oscillator 100 taken along a line IB. FIG. 2 is a diagram illustrating an example of analysis of an electric field stably existing in a patch antenna (in a resonator) in an oscillation frequency $f_{osc}$ (=1 THz). FIGS. 3A and 3B are diagram illustrating admittance characteristics of the oscillator 100 according to the present invention. FIGS. 4A and 4B are diagrams illustrating appearance of an oscillator of a first example according to the present invention. FIGS. 5A and 5B are diagrams illustrating modifications of the oscillator according to the embodiment of FIGS. 1A and 1B. FIGS. 6A and 6B are diagrams illustrating appearance of an oscillator of a second example according to an embodiment of the present invention.

First, a configuration of the oscillator 100 will be described. A negative resistance element 101 has a region in which current is reduced in accordance with increase of voltage due to current-voltage characteristics, that is, a region having negative resistance. Typically, a high frequency element such as a resonant tunneling diode (RTD), an Esaki diode, a Gunn diode, or a transistor having a terminated end is suitably used as the negative resistance element 101. For example, a TUNNETT diode, an IMPATT diode, a hetero-joined bipolar transistor (HBT), a compound semiconductor field-effect transistor (FET), or a high-electron-mobility transistor (HEMT) may be used. Furthermore, a negative resistance of a Josephson element using a superconductor may be used. Hereinafter, a case where an RTD which is a typical negative resistance element operating in a terahertz-wave band is used as the negative resistance element 101 will be described as an example.

A patch antenna 102 serves as a resonator in a terahertz-wave band, and more specifically, serves as a microstrip type resonator using a microstrip line of a limited length or the like. The patch antenna 102 is configured such that the negative resistance element 101 and a dielectric body 107 are sandwiched between two conductors, that is, a patch conductor 108 and a grounded conductor 109. Here, the term "dielectric body" represents a substance in which dielectric property is superior to electrical conductivity and represents a material serving as an insulator or a high resistance element which is not electrified relative to DC voltage. Typically, a material having resistivity of 1 kΩm or more is suitably used. Examples of such a material include plastic, ceramic, silicon oxide, and silicon nitride.

The patch antenna 102 is configured such that a width of the patch conductor 108 in a direction of IB is λ/2 of the resonator. The patch antenna 102 is an active antenna including the negative resistance element 101 mounted thereon. Therefore, an oscillation frequency $f_{osc}$ defined by the patch antenna 102 of the oscillator 100 is determined as a resonance frequency of an entire parallel resonance circuit in which reactance of the patch antenna 102 and reactance of the negative resistance element 101 are combined with each other. Specifically, according to an equivalent circuit of an RTD oscillator disclosed in Jpn. J. Appl. Phys., Vol. 47, No. 6, pp. 4375-4384 (2008), for a resonance circuit in which admittance of an RTD and admittance of an antenna ($Y_{RTD}$ and $Y_{ANT}$), are combined with each other, a frequency which satisfies the following two conditions is determined as the oscillation frequency $f_{osc}$.

Amplitude Condition:$Re[Y_{RTD}]+Re[Y_{ANT}] \leq 0$  Expression 1

Phase Condition:$Im[Y_{RTD}]+Im[Y_{ANT}]=0$  Expression 2

Here, "$Re[Y_{RTD}]$" represents admittance of a negative resistance element and has a negative value.

A bias circuit for controlling a bias voltage of the negative resistance element 101 includes a power source 105 and a line 106. The line is represented as an inductance 106 in FIG. 1 since the line generally has a parasitic inductance component. The power source 105 supplies electric current used to drive the negative resistance element 101 to thereby control the bias voltage. The bias voltage is typically selected from a negative resistance region of the negative resistance element 101. A strip conductor 1031 has a function of supplying the bias voltage from the bias circuit including the power source 105 and the inductance 106 to the negative resistance element 101. The strip conductor 1031 functions as an inductance L in a frequency domain for frequencies lower than the oscillation frequency $f_{osc}$.

A resistance 104 and a capacitance 1032 connected to the resistance 104 in parallel constitute a low impedance circuit. The low impedance circuit suppresses parasitic oscillation of a resonance frequency $f_{sp1}$ ($f_{sp1}<f_{osc}$, typically a frequency band from the DC to 10 GHz) which is a comparatively low frequency caused by the bias circuit including the power source 105 and the line 106. As a value of the resistance 104, a value equal to or slightly smaller than an absolute value of a negative resistance in the negative resistance region of the negative resistance element 101 is selected. As with the resistance 104, the capacitance 1032 is also configured such that impedance of the element becomes smaller than the absolute value of the negative resistance of the negative resistance element 101. In general, the capacitance 1032 is preferably large, and is approximately several pF in this embodiment. The capacitance 1032 is a decoupling capacitor directly connected to the strip conductor 1031, and an MIM structure including a patch and a substrate may be employed, for example.

Meanwhile, inductance of the strip conductor 1031 and capacitance of the patch antenna 102 form an LC resonance having a frequency $f_{sp2}$ ($f_{sp2}<f_{osc}$). The frequency $f_{sp2}$ is determined in accordance with a length of the strip conductor 1031 and an area of the patch antenna 102 and is typically a range from 10 to 500 GHz. The strip conductor 1031 which has a wiring structure and the patch antenna 102 are disposed close to each other due to a structure of the microstrip resonator. Therefore, it is not easy to connect the low impedance circuit constituted by the resistance 104 and the capacitance 1032 described above to the patch antenna 102 without interference with a resonance electric field of the frequency $f_{osc}$. Accordingly, in the related art, it is difficult to suppress oscillation of the parasitic frequency $f_{sp2}$.

The oscillator 100 of the present invention includes the patch antenna 102 and the patch antenna 102 includes a resistance element 110 which is a parallel resistance disposed in parallel to the negative resistance element 101. In the resistance element 110, a resistance R, a position, and a structure are set so that "$Re[Y_{RTD}]+Re[Y_{ANT}]>0$" is satisfied in a low frequency domain which is smaller than the frequency $f_{osc}$ and which includes the frequency $f_{sp2}$ and "$Re[Y_{RTD}]+Re[Y_{ANT}] \leq 0$" is satisfied in a frequency domain of the frequency $f_{osc}$. Here, "Re $[Y_{RTD}]$" has a negative value which is asymptotic relative to a reciprocal of the negative resistance of the negative resistance element 101 in DC.

The resistance R is a finite value larger than 0Ω. When the resistance R is 0Ω, a resonance characteristic of the patch antenna 102 changes similarly to a general short circuit, and accordingly, a mode other than the frequency $f_{osc}$ is excited. Therefore, the object of the present invention is not satisfied. Furthermore, when the resistance R becomes large, a value of Re$[Y_{ANT}]$, relatively becomes larger than an absolute value of Re$[Y_{RTD}]$. Consequently, an efficient loss in a low frequency domain is not attained. Accordingly, the resistance R of the resistance element 110 has an optimum range which is set in accordance with a structure and a material of a resonator and a magnitude of a negative resistance of a negative resistance element. The resistance R is preferably set to a value similar to a characteristic impedance of a used microstrip resonator, and typically, the resistance R is within an optimum range equal to or larger than 1/10 of the characteristic impedance and equal to or smaller than ten times of the characteristic impedance. The characteristic impedance is approximately determined in accordance with a size of the resonator and a material and a thickness of the dielectric body, and accordingly, the optimum range of the resistance R is changed in accordance with the structure and a material of the resonator. The range equal to or larger than 1/10 of the characteristic impedance of the microstrip resonator and equal to or smaller than ten times of the characteristic impedance in a frequency domain from millimeter waves to terahertz waves (10 mm to 10 μm of a wavelength in a vacuum) approximately corresponds to a range equal to or larger than 0.1Ω and equal to or smaller than 1000Ω. Furthermore, the resistance R is preferably set to a value smaller than an absolute value (that is, −1/Re $[Y_{RTD}]$) of the negative resistance of the RTD in the DC. Accordingly, the value of the resistance R may be set in accordance with a magnitude of the negative resistance of the oscillator 100 and current density.

As the material of the resistance element 110, a metal having high resistance such as constantan, nickel chrome, or bismuth, structural resistance formed by a metallic thin film, a conductive resin, or a semiconductor in which doping is controlled may be suitably used. Furthermore, a contact resistance in a boundary surface between a semiconductor and a metal, a Schottky barrier diode generated in a boundary surface between a semiconductor and a metal, or a nonlinear resistance formed between a source and a drain or between an emitter and a collector of a three-terminal transistor may be used. In any material and structure, the resistance R is set within the range described above by controlling the structure of the resistance element 110.

The resistance element 110 is disposed in a position corresponding to a substantive node in a high-frequency electric field stably existing in the patch antenna 102 in the oscillation frequency $f_{osc}$ in the terahertz-wave band defined by the patch antenna 102 and the negative resistance element 101. Here, the position corresponding to the substantive node is preferably a position in which electric field strength of the oscillation frequency $f_{osc}$ stably existing in the patch antenna 102 reduces by approximately one digit, that is, typically, a position in which the electric field strength becomes equal to or smaller than $1/e^2$ of the maximum electric field strength ("e" is a base of natural logarithm).

FIG. 2 is a diagram illustrating a result of analysis of an electric field stably existing in a patch antenna 202 in an oscillation frequency $f_{osc}$ (=0.95 THz) performed using a high-frequency simulator HFSS developed by Ansoft Corporation in a structure of an oscillator 200 including an RTD disclosed in a first example mounted thereon. A hatched region of FIG. 2 is a region having a stably-existing electric field corresponding to 1/10 of the maximum electric field strength and represents a typical example of a position of a substantive node suitable for arrangement of a resistance element. The resistance element 110 is preferably configured so as not to interfere with the electric field stably existing in the patch antenna 202 depending on a value of the resistance R and preferably has a size in which the resistance element 110 is accommodated in the hatched region corresponding to the substantive node. Typically, the size is preferably equal to or smaller than 1/5 of a resonator length or equal to or smaller than 1/10 of an oscillation wavelength $\lambda_{osc}$.

In an active antenna operating in a terahertz-wave band, a frequency shift caused by reactance of the negative resistance element is large, and accordingly, as illustrated in FIG. 2, the electric field of the oscillation frequency $f_{osc}$ stably existing in the patch antenna 202 may not be symmetrically distributed. Therefore, the node of the electric field of the oscillation frequency $f_{osc}$ may be distributed in a region other than the center of the patch antenna. In this case, the resistance element is disposed in a position closer to the negative resistance element 101 relative to the center of the resonator.

FIGS. 3A and 3B are diagrams illustrating a result of analysis of admittance characteristics of the oscillator 200 including the RTD disclosed in the first example mounted thereon. FIG. 3A is a graph obtained by plotting a real part Re$[Y_{RTD}]$ of admittance of the RTD and a real part Re$[Y_{ANT}]$ of admittance of the patch antenna 202. FIG. 3B is a graph obtained by plotting an imaginary part Im$[Y_{RTD}]$ of the admittance of the RTD and an imaginary part Im$[Y_{ANT}]$ of the admittance of the patch antenna 202. In the graphs, a real part Re$[Y_{ANT}]$ and an imaginary part Im$[Y_{ANT}]$ of admittance of a patch antenna which includes a resistance element 210 disclosed in the present invention and a real part Re$[Y_{ANT}]$ and an imaginary part Im$[Y_{ANT}]$ of admittance of a general patch antenna which does not include a resistance element are illustrated. According to FIG. 3B, the oscillation frequency $f_{osc}$ which satisfies Expression 2 is 0.95 THz. Furthermore, it is estimated that the frequency $f_{sp2}$ of the LC resonance is 0.3 THz when the resistance element 210 is included whereas the frequency $f_{sp2}$ of the LC resonance is 0.25 THz when resistance is not included in a general manner. Although a frequency shift is generated in the frequency $f_{sp2}$ since resonance characteristics are changed by the resistance element 210, change of the frequency $f_{osc}$ is negligible since the frequency $f_{osc}$ exists in the substantive node. According to FIG. 3A, when the resistance element 210 is not included, the frequencies $f_{osc}$ and $f_{sp2}$ both satisfy the oscillation conditions of Expressions 1 and 2. Accordingly, it is likely that parasitic oscillation including the LC resonance is generated. On the other hand, when the resistance element 210 is included, although the frequency $f_{osc}$ satisfies the oscillation conditions, a low frequency region from DC inclusive to the frequency $f_{osc}$ exclusive including the frequency $f_{sp2}$ corresponds to low impedance and does not satisfy the oscillation condition of Expression 1. Accordingly, the parasitic oscillation including the LC resonance is suppressed.

As described above, the oscillator disclosed in the present invention realizes an oscillation circuit which has high impedance in the vicinity of the desired oscillation frequency $f_{osc}$ in the terahertz-wave band and low impedance in a frequency domain of parasitic oscillation from DC to the frequency $f_{osc}$ exclusive including the frequency $f_{sp2}$. With this configuration, a loss of the oscillation frequency $f_{osc}$ in the terahertz-wave band may be minimized and loss in the frequency of the parasitic oscillation may be maximized by arbitrarily designing the antenna structure and the size and the arrangement of the resistance element. Accordingly, with this configuration of the present invention, even in an oscillator using a microstrip type resonator, parasitic oscillation in low frequencies caused by a bias circuit and a power supply structure may be suppressed, and only an oscillation frequency $f_{osc}$ in a desired terahertz-wave band defined by a resonator may be stably oscillated.

FIG. 5 is a diagram illustrating a modification of the oscillator according to an embodiment of the present invention. Here, description of components the same as those of the oscillator 100 is omitted. An oscillator 400 is configured as a push-pull type oscillator in which two negative resistance elements 401a and 401b are symmetrically arranged relative to the center of a patch serving as an axis in a direction in which an electric field stably existing in a patch antenna resonates. In this case, the electric field stably existing in the antenna is symmetrical in a direction of resonance using the center of the antenna as an axis and a node of the electric field is distributed in the vicinity of the center of the antenna. Accordingly, resistance elements 410a and 410b are disposed in the vicinity of the center of the patch. Furthermore, as illustrated as an oscillator 500, even when a resistance element 510 is disposed between a strip conductor 1031 and a grounded conductor 109, an effect of suppressing parasitic oscillation is expected.

More concrete examples of an oscillator will be described in examples below.

FIRST EXAMPLE

Figure 4C:
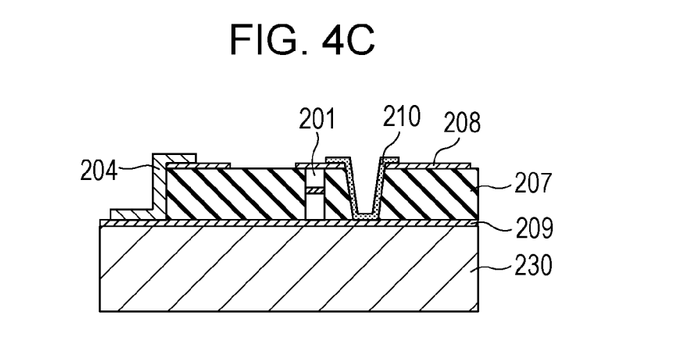
FIG. 4C is a sectional view of a modification of the oscillator of the first example taken along a line IVC.

The oscillator 200 according to a first example will be described with reference to FIGS. 4A to 4C. The oscillator 200 generates an oscillation frequency $f_{osc}$ of 0.95 THz. In this example, an RTD is used as a negative resistance element 201. The RTD used in this example has a multiple quantum well structure of InGaAs/InAlAs and InGaAs/AlAs and an electrical contact layer of n-InGaAs which are formed on an InP substrate 230. As the multiple quantum well structure, a triple barrier structure is used, for example. More specifically, the multiple quantum well structure is constituted by a semiconductor multilayer structure of AlAs (1.3 nm)/InGaAs (7.6 nm)/InAlAs (2.6 nm)/InGaAs (5.6 nm)/AlAs (1.3 nm). Among them, InGaAs is a well layer, and a lattice-matched InAlAs and lattice-mismatched AlAs are barrier layers. These layers are undoped layers, that is, carrier dope is not intentionally performed on the layers. The multiple quantum well structure is sandwiched between electric contact layers of n-InGaAs having electron concentration of $2 \times 10^{18}$ cm$^{-3}$. In current-voltage I(V) characteristics of the structure between the electric contact layers, a peak current density is 280 kA/cm$^2$ and a negative resistive region corresponds to a range from approximately 0.7 V to approximately 0.9 V. In a case of a mesa structure having an RTD of approximately 2 µmΦ, a peak current of 10 mA and a negative resistance of −20Ω are obtained.

The patch antenna 202 is a square patch including a patch conductor 208 having sides of 60 µm, and BCB (Benzocyclobutene developed by The Dow Chemical Company, $\epsilon_r$=2.4) having a thickness of 3 µm is disposed between the patch conductor 208 and a grounded conductor 209 as a dielectric body 207. The RTD 201 having a diameter of 2 µm is connected between the patch conductor 208 and the grounded conductor 209, and the RTD 201 is disposed in a position shifted by 24 µm from the center of the patch conductor 208 in a resonance direction. Although a resonance frequency of only the patch antenna 202 is approximately 1.5 THz, an oscillation frequency $f_{osc}$ of the oscillator 200 is approximately 0.95 THz taking reactance of the RTD corresponding to the negative resistance element 201 into consideration.

The patch conductor 208 is connected to an MIM capacitor 2032 through two microstrip lines 2031 having a width of 5 µm and a length of 15 µm. Capacitance of the MIM capacitor 2032 is 10 pF in this example. Lines 206 including wire bonding are connected to the MIM capacitor 2032 so that a bias voltage of the negative resistance element 201 is controlled by a power source 205. A frequency $f_{sp2}$ of an LC resonance formed by inductance of the microstrip lines 2031 and capacitance of the patch antenna 202 is approximately 0.30 THz.

The resistance element 210 is a parallel resistor arranged in parallel to the negative resistance element 201 and is formed by cylindrical constantan (Cu—Ni alloy, 5e-5Ω·m) having a diameter of 2 µm and a height of 3 µm. The resistance element 210 is connected between the patch conductor 208 and the grounded conductor 209 so as to have resistance of 20Ω and is disposed beneath a position (a position A of FIG. 2) shifted by 15 µm from the center of the patch conductor 208 in the resonance direction. This position is located in the vicinity of a node of a high frequency electric field stably existing in the patch antenna 202 in the oscillation frequency $f_{osc}$ of 0.95 THz, and therefore, the resistance element 210 does not interfere with a resonance electric field of the frequency $f_{osc}$. Here, as is clear from the result of the admittance analysis illustrated in FIGS. 3A and 3B, the frequency $f_{osc}$ satisfies the oscillation condition of Expression 1 when the resistance element 210 is disposed. However, the oscillation condition of Expression 1 is not satisfied in a low frequency region from DC inclusive to $f_{osc}$ exclusive including the frequency $f_{sp2}$ since the region corresponds to low impedance. Accordingly, parasitic oscillation of low frequencies caused by a bias circuit and a power supply structure is suppressed, and therefore, the oscillator 200 is capable of stably oscillating only the oscillation frequency $f_{osc}$ in a desired terahertz-wave band defined by the patch antenna 202 serving as a resonator.

According to this embodiment, the oscillator 200 is fabricated as follows. First, a layer is epitaxially grown on the InP substrate 230 by a molecular beam epitaxy (MBE) method or a metal organic vapor phase epitaxy (MOVPE) method. Specifically, an RTD of n-InP/n-InGaAs and InGaAs/InAlAs is epitaxially grown in this order. When an n-type conductive substrate is selected as the InP substrate 230, the epitaxial growth is started from n-InGaAs. Next, the RTD 201 is subjected to etching so that the mesa RTD 201 of a circular arc shape having a diameter of 2 µm is obtained. Here, dry etching using electron beam (EB) lithography and inductively coupled plasma (ICP) is employed. Photolithography may be used. Subsequently, the grounded conductor 209 is formed on an etched surface by a lift-off method. A passivation layer may be formed to protect a side wall of the RTD 201. Furthermore, embedding is performed with BCB serving as the dielectric body 207 by a spin coating method and dry etching, and upper electrodes of the patch conductor 208, the microstrip lines 2031, and the MIM capacitor 2032 of Ti/Pd/Au are formed by a lift-off method. Next, materials constituting the patch conductor 208 and the dielectric body 207 in a portion corresponding to the position A which forms the resistance element 210 are removed by photolithography and dry etching. Furthermore, constantan having a thickness of 3 µm serving as the resistance element 210 is embedded in the removed portion by a lift-off method so that the patch conductor 208 and the grounded conductor 209 are connected to each other. Finally, a Bi pattern is formed in a portion to be a resistor 204 so that the grounded conductor 209 and the upper electrode of the MIM capacitor 2032 are connected to each other. The oscillator 200 of this embodiment is thus completed.

Power is supplied to the oscillator 200 from the bias circuit including the power source 205 and the lines 206 through the microstrip lines 2031 disposed in the center of the patch antenna 202 where appropriate. In general, when a bias voltage is applied in the negative resistance region to supply a bias current, the oscillator 200 is activated. Note that, as a modification of this embodiment, structural resistance of a thin film of a high resistive metal such as Bi formed in a via hole may be used as the resistance element 210 as illustrated in FIG. 4C.

In this example, the triple barrier resonant tunneling diode formed by InGaAs/InAlAs and InGaAs/AlAs grown on the InP substrate has been described as the RTD. However, the present invention is not limited to the structure and the material system, and the semiconductor element according to the present invention may be provided by combinations of other structures and other materials. For example, a resonant tunneling diode having a double barrier quantum well structure or a resonant tunneling diode having a multiple barrier quantum well structure, that is, a quantum well structure of a quadruple barrier or more, may be used. Furthermore, as the material system, GaAs/AlGaAs, GaAs/AlAs or InGaAs/GaAs/AlAs formed on a GaAs substrate may be used. Furthermore, InGaAs/AlGaAsSb formed on an InP substrate may be used. Furthermore, InAs/AlAsSb or InAs/AlSb formed on an InAs substrate may be used. Moreover, SiGe/SiGe formed on an Si substrate may be used. Moreover, a combination of at least some of them may be used. The structure and the material are appropriately selected in accordance with a desired frequency, for example. Although the case where carriers correspond to electrons has been described in the present invention, the present invention is not limited to this and holes may be used. Furthermore, the substrate and the material of the dielectric body are selected in accordance with usage, and a semiconductor such as silicon, gallium arsenide, indium arsenide, or gallium phosphide, glass, ceramic, Teflon (registered trademark), or resin such as polyethylene terephthalate may be used.

SECOND EXAMPLE

An oscillator 300 according to a second example will be described with reference to FIGS. 6A and 6B. FIG. 6A is a perspective view of the oscillator 300 and FIG. 6B is a sectional view of the oscillator 300 taken along a line VIB. The oscillator 300 generates an oscillation frequency of 0.60 THz. A resonant tunneling diode (RTD) of the first example is used as a negative resistance element 301 and a patch antenna 302 is used as a resonator. Description of configurations the same as those of the first example is omitted.

In the oscillator 300, two resistance elements 310a and 310b are disposed in positions included in a node of a high frequency electric field stably existing in the patch antenna 302. In this way, a plurality of parallel resistors may be disposed in accordance with electric field distribution illustrated in FIG. 2. The patch antenna 302 is a square patch having sides (L) of 150 μm, and a patch conductor 308 is connected to a power source (not illustrated) through a microstrip line 3031 having a width of 5 μm and a length of 38 μm.

BCB having a thickness of 3 μm is disposed between the patch conductor 308 and a grounded conductor 309 as a dielectric body 307. The RTD, that is, the negative resistance element 301 having a diameter of 2 μm is connected between the patch conductor 308 and the grounded conductor 309, and the negative resistance element 301 is disposed in a position shifted by 60 μm from the center of the patch conductor 308 in a resonance direction. Although resonance frequency of only the patch antenna 302 is approximately 0.8 THz, an oscillation frequency $f_{osc}$ is approximately 0.60 THz taking reactance of the negative resistance element 301 into consideration. Furthermore, a frequency $f_{sp2}$ of an LC resonance formed by inductance of the microstrip line 3031 and capacitance of the patch antenna 302 is approximately 0.1 THz.

The two resistance elements 310a and 310b are parallel resistors disposed in parallel to the negative resistance element 301 and formed by contact resistance of a semiconductor and a metal. The semiconductor has a cylinder structure having a diameter of 5 μm and a height of 2.7 μm, and formed by removing a portion corresponding to the RTD of the negative resistance element 301 by etching. A surface of the semiconductor is formed by n-InGaAs of $2 \times 10^{18}$ cm$^{-3}$, is contact with a Ti/Pd/Au electrode (20 nm/20 nm/200 nm) serving as the patch conductor 308 by an area having a diameter of 1 μm, and has a contact resistance of approximately 5Ω. The resistance elements 310a and 310b connect the patch conductor 308 to the grounded conductor 309 so as to have 5Ω, and are disposed beneath positions shifted by 60 μm in the resonance direction and shifted by ±60 μm in a direction of the line VIB from the center of the patch conductor 308. These positions are included in a node of a high frequency electric field stably existing in the patch antenna 302 in the oscillation frequency $f_{osc}$ of 0.60 THz, and therefore, the resistance elements 310a and 310b do not interfere with a resonance electric field. Here, the frequency $f_{osc}$ satisfies the oscillation conditions whereas the frequency $f_{sp2}$ becomes low impedance and does not satisfy the oscillation conditions. Accordingly, the oscillator 300 may stably oscillate only an oscillation frequency $f_{osc}$ of a desired terahertz-wave band defined by the resonator while low frequency parasitic oscillation caused by a bias circuit and a power supply structure is suppressed.

According to an aspect of the present invention, in a microstrip resonator such as a patch antenna including a negative resistance element mounted thereon, a parallel resistor is disposed in a substantive node of an electric field of an oscillation frequency $f_{osc}$ of a terahertz-wave band stably existing in the resonator. With this configuration, an oscillation circuit configured such that a range in the vicinity of the desired oscillation frequency $f_{osc}$ in the terahertz-wave band corresponds to high impedance and a range in the vicinity of the frequency $f_{sp}$ of the parasitic oscillation ($f_{sp} < f_{osc}$) corresponds to low impedance is realized. Accordingly, even in an oscillator using a microstrip type resonator, parasitic oscillation caused by a wiring structure may be suppressed and an oscillation frequency $f_{osc}$ of a desired terahertz-wave band defined by the resonator may be stably obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-073648, filed Mar. 29, 2013, which is hereby incorporated by reference herein in its entirety.

What is claimed is:

1. An oscillator which oscillates a terahertz wave of a frequency $f_{osc}$ defined by a microstrip resonator configured such that a negative resistance element and a dielectric body are sandwiched between two conductors, the oscillator comprising:
- a resistance element disposed in parallel to the negative resistance element,
- wherein the resistance element is disposed in a position corresponding to a node of an electric field stably existing in the resonator in the frequency $f_{osc}$ of the oscillated terahertz wave, and
- wherein the resistance element is disposed in a position where strength of the electric field stably existing in the resonator is equal to or smaller than $1/e^2$, e is a base of natural logarithm, of the maximum electric field strength.

2. The oscillator according to claim 1, wherein the resistance element has one side disposed on the resonator.

3. The oscillator according to claim 1, wherein the resonator includes a patch antenna.

4. The oscillator according to claim 1, further comprising:
- a bias circuit which includes a power source and wiring and which is used to control a bias voltage of the negative resistance element; and
- a strip conductor used to connect the resonator to the bias circuit,
- wherein the resistance element is disposed between the strip conductor and an electrical ground.

5. The oscillator according to claim 1, wherein the resistance element includes a contact resistance of a semiconductor and a metal.

6. The oscillator according to claim 1, wherein the resistance element is a non-linear resistor.

7. The oscillator according to claim 1, wherein the resistance element includes a Schottky barrier diode.

8. The oscillator according to claim 1, wherein resistance of the resistance element is a finite value and is equal to or larger than 1/10 of characteristic impedance of the resonator and equal to or smaller than ten times of the characteristic impedance of the resonator.

9. The oscillator according to claim 1, wherein resistance of the resistance element is a finite value and is equal to or larger than $0.1\Omega$ and equal to or smaller than $1000\Omega$.

10. The oscillator according to claim 1, further comprising:
- a bias circuit which includes a power source and wiring and which is used to control a bias voltage of the negative resistance element,
- wherein the resistance element is set such that a frequency band in the vicinity of the frequency $f_{osc}$ of the oscillated terahertz wave has high impedance of the bias circuit and a frequency band including a frequency $f_{sp}$ of parasitic oscillation, $f_{sp}$ being less than $f_{osc}$, has low impedance of the bias circuit.

11. The oscillator according to claim 1,
- wherein the resistance element is set so as to satisfy Expression "Re[$Y_{RTD}$]+Re [$Y_{ANT}$]≤0" in a frequency band in the vicinity of a frequency $f_{osc}$ of the oscillated terahertz wave and satisfy Expression "Re[$Y_{RTD}$]+Re [$Y_{ANT}$]>0" in a frequency band including a frequency $f_{sp}$ of parasitic oscillation, $f_{sp}$ being less than $f_{osc}$, "Re [$Y_{RTD}$]" representing a real part of admittance of the negative resistance element, and "Re[$Y_{ANT}$]" representing a real part of admittance of the resonator.

12. An oscillator which oscillates a terahertz wave of a frequency $f_{osc}$ defined by a microstrip resonator configured such that a negative resistance element and a dielectric body are sandwiched between two conductors, the oscillator comprising:
- a resistance element disposed in parallel to the negative resistance element,
- wherein the resistance element is disposed in a position corresponding to a node of an electric field stably existing in the resonator in the frequency $f_{osc}$ of the oscillated terahertz wave, and
- wherein the resistance element is disposed in a position closer to the negative resistance element relative to the center of the resonator.

* * * * *